US010559677B2

United States Patent
You et al.

(10) Patent No.: US 10,559,677 B2
(45) Date of Patent: Feb. 11, 2020

(54) METHOD OF FABRICATING AN ENHANCEMENT MODE GROUP III-NITRIDE HEMT DEVICE AND A GROUP III-NITRIDE STRUCTURE FABRICATED THEREFROM

(71) Applicant: IMEC VZW, Leuven (BE)

(72) Inventors: Shuzhen You, Leuven (BE); Niels Posthuma, Elewijt (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/353,952

(22) Filed: Nov. 17, 2016

(65) Prior Publication Data
US 2017/0179272 A1 Jun. 22, 2017

(30) Foreign Application Priority Data
Dec. 18, 2015 (EP) .................................. 15201152

(51) Int. Cl.
*H01L 29/778* (2006.01)
*H01L 21/02* (2006.01)
(Continued)

(52) U.S. Cl.
CPC ...... *H01L 29/7787* (2013.01); *H01L 21/0217* (2013.01); *H01L 21/0254* (2013.01);
(Continued)

(58) Field of Classification Search
CPC .............. H01L 29/778; H01L 29/1066; H01L 29/2003; H01L 29/205; H01L 29/42316; H01L 29/66462; H01L 29/7786
See application file for complete search history.

(56) References Cited

U.S. PATENT DOCUMENTS 6,492,227 B1 * 12/2002 Wang ................ H01L 21/28273
257/E21.209
2002/0171076 A1 * 11/2002 Danzilio ............. H01L 29/7783
257/12
(Continued)

FOREIGN PATENT DOCUMENTS

| EP | 2 602 827 A2 | 6/2013 |
| EP | 2602827 A2 | 6/2013 |
| WO | WO2015008430 A1 | 1/2015 |

OTHER PUBLICATIONS

European Search Report issued in connection with Application No. EP 16195889.7 dated May 12, 2017, 9 pages.

*Primary Examiner* — Dale E Page
*Assistant Examiner* — Quovaunda Jefferson
(74) *Attorney, Agent, or Firm* — McDonnell Boehnen Hulbert & Berghoff LLP (57) ABSTRACT

The disclosure relates to a method of fabricating an enhancement mode Group III-nitride HEMT device and a Group III-nitride structure fabricated therefrom. One example embodiment is a method for fabricating an enhancement mode Group III-nitride HEMT device. The method includes providing a structure. The structure includes a substrate having a main surface. The structure also includes a layer stack overlying the main surface. Each layer of the layer stack includes a Group III-nitride material. The structure further includes a capping layer on the layer stack. The method also includes forming a recessed gate region by removing, in a gate region, at least the capping layer by performing an etch process, thereby exposing a top surface of an upper layer of the layer stack. The method further includes forming a p-type doped GaN layer in the recessed gate region and on the capping layer by performing a non-selective deposition process.

19 Claims, 8 Drawing Sheets

(51) Int. Cl.
*H01L 21/306* (2006.01)
*H01L 29/20* (2006.01)
*H01L 29/205* (2006.01)
*H01L 29/423* (2006.01)
*H01L 29/66* (2006.01)
*H01L 29/10* (2006.01)

(52) U.S. Cl.
CPC .... *H01L 21/30612* (2013.01); *H01L 29/1066* (2013.01); *H01L 29/2003* (2013.01); *H01L 29/205* (2013.01); *H01L 29/42316* (2013.01); *H01L 29/66462* (2013.01); *H01L 29/7786* (2013.01)

(56) References Cited

U.S. PATENT DOCUMENTS

| | | | |
|---|---|---|---|
| 2006/0124956 A1* | 6/2006 | Peng | C30B 29/403 257/103 |
| 2011/0012128 A1* | 1/2011 | Lahreche | H01L 21/02378 257/76 |
| 2011/0140081 A1* | 6/2011 | Jiang | H01L 33/0079 257/13 |
| 2013/0153923 A1* | 6/2013 | Decoutere | H01L 29/66462 257/76 |
| 2014/0097433 A1 | 4/2014 | Negoro et al. | |
| 2014/0183598 A1* | 7/2014 | Chiu | H01L 29/42364 257/190 |
| 2016/0118489 A1 | 4/2016 | Nikita et al. | |

\* cited by examiner

Figure 4

METHOD OF FABRICATING AN ENHANCEMENT MODE GROUP III-NITRIDE HEMT DEVICE AND A GROUP III-NITRIDE STRUCTURE FABRICATED THEREFROM

CROSS-REFERENCE TO RELATED APPLICATIONS

The present application is a non-provisional patent application claiming priority to European Patent Application No. EP 15201152.4, filed Dec. 18, 2015, the contents of which are hereby incorporated by reference.

FIELD OF THE DISCLOSURE

The present disclosure relates to the field of nitride semiconductor devices. More specifically, the present disclosure relates to a method for fabricating an enhancement mode Group III-nitride high electron mobility transistor (HEMT) and a Group III-nitride structure fabricated thereof.

BACKGROUND

Enhancement mode (E-mode) devices based on GaN technology are interesting for power system applications. Utilization of a p-type GaN or a p-type AlGaN layer under the gate metal depletes the channel so as to achieve normally-off operation.

In a typical HEMT device, a blanket Mg-doped p-type GaN or a blanket Mg-doped p-type AlGaN layer is grown on top of an AlGaN barrier. A selective p-GaN to AlGaN etch is used to fabricate the p-type GaN gate and to remove the p-GaN layer in the access region positioned between a gate and a source/drain. Etching of p-GaN selective to AlGaN is difficult and furthermore leaves the surface between the gate and the source/drain damaged. Moreover, during growth of the p-GaN layer, Mg diffuses into the AlGaN/GaN stack. As a result, the device architecture is subject to a high resistive 2DEG access region and dispersion, which leads to current collapse. The blanket p-GaN growth also limits the threshold voltage ($V_{TH}$) of the device.

An alternative approach is presented a European patent application, EP2 602 827 A2. In this patent application, a selective regrowth of the p-GaN layer in a recessed gate region is described, where an in-situ grown SiN layer is present in the access region. Although this approach may solve potential dispersion issues and avoid Mg diffusing into the access region thanks to the presence of the SiN in the access region, this method is subject to loading effects during regrowth of the p-type GaN layer, which make the growth rate, the thickness and the doping concentration of the regrown p-GaN layer dimension dependent. A high growth rate of the p-GaN layer in the gate area results in reduced incorporation of Mg into the p-GaN layer.

A non-selective regrowth of p-GaN layer in the recessed gate region and in the access region is also disclosed in the same European patent application, EP2 602 827 A2. However, the p-GaN layer regrown by non-selective deposition is likely to suffer from low threshold voltage compared to that obtained by p-GaN regrown by selective growth since temperature of non-selective growth is reported to be lower that the temperature of selective growth.

An enhancement mode Group III/nitride HEMT provided with more flexibility in design to obtain high $V_{TH}$, high drain current ($I_{DS}$) and with reduced loading effects may be useful.

SUMMARY

Some embodiments may provide methods for fabricating an enhancement mode Group III-nitride HEMT.

Some embodiments allow for fabricating an enhancement mode Group III-nitride HEMT with improved device characteristics such as for instance, increased $V_{TH}$ and $I_{DS}$.

Some embodiments allow for increased activation of the p-type dopant, which may be Mg, of the p-type doped GaN layer, thus aiding to provide increased $V_{TH}$.

Some embodiments prevent diffusion of the p-type dopant, which may be Mg, of the p-type doped GaN layer into the barrier layer and into the channel layer in the access region so that the 2DEG density in the channel layer is maintained to obtain a high drain current, $I_{DS}$.

Some embodiments allow for fabricating an enhancement mode Group III-nitride HEMT device with reduced dispersion due to the absence of Mg diffusion in the AlGaN barrier and GaN channel and due to absence of etch damage close to the 2DEG Some embodiments allow for obtaining a monocrystalline regrown p-type doped GaN layer both in the recessed gate region and in the access region, thus, avoiding potential segregation of dopants and diffusion of dopant through grain boundaries of the p-type poly GaN layer.

Some embodiments allow for growing a p-type doped GaN layer without being influenced by loading effects since the thickness and the doping concentration of the regrown p-type doped GaN layer will not depend on the size or the width of the recessed gate region.

Some embodiments allow the growth of p-type doped GaN layer to become independent of the size of the gate region thus overcoming loading effects and allowing for freedom for defining the size or the width of the recessed gate region.

Some embodiments allow the diffusion of the p-type dopant into the barrier layer in the access region is avoided thus giving additional freedom to design of the AlGaN barrier and p-type doped GaN in the access region and the gate region.

Some embodiments allow a recess of the gate thereby providing additional freedom to design of the AlGaN barrier and p-type doped GaN in the access region and the gate region.

Some of the above objectives may be accomplished by methods according to various embodiments.

In a first aspect, the present disclosure describes a method for fabricating an enhancement mode Group III-nitride High Electron Mobility Transistor (HEMT) device. The method comprises providing a structure. The structure comprises a substrate having a main surface, a layer stack overlying the main surface, wherein each layer of the layer stack comprises a Group III-nitride material, and a capping layer on the layer stack. A recessed gate region is formed by removing, in a gate region, at least the capping layer by performing an etch process. The removing exposes a top surface (51) of an upper layer of the layer stack, at the bottom of the recessed gate region. A p-type doped GaN layer (80) is formed in the recessed gate region and on the capping layer by performing a non-selective deposition process. The non-selective deposition process is performed at a predetermined temperature in the range of 750° C. to 1,100° C. and the capping layer comprises a material susceptible to nucleation of the p-type doped GaN layer at the predetermined temperature.

In embodiments, the upper layer of the layer stack may be III-nitride layer that allows formation of 2DEG in the channel by polarization charge.

In embodiments, the capping layer (60) may be formed in-situ with the layer stack.

Some embodiments allow, by forming the capping layer in-situ with the layer stack, for covering the layer stack with the capping layer without vacuum break between the step for forming the capping layer and forming the layer stack.

In embodiments, the material of the capping layer (60) may be an oxide or an un-doped Group III-nitride material.

Some embodiments, due to the oxide or the un-doped Group III-nitride material comprising capping layer, allow for nucleating the p-type doped GaN layer on the access region as well as in the recessed gate region at a temperature in the range of 750° C. to 1,100° C., thereby allowing non-selective deposition of the p-type doped GaN layer in the recessed gate region and in the access region.

Some embodiments, by growing the p-type doped GaN layer non-selectively at the temperature in the range of 750° C. to 1,100° C., allow for activating the p-type dopant of the p-type doped GaN layer. Activation of the p dopant allows for obtaining a HEM device with an increased threshold voltage.

In embodiments, the un-doped Group III-nitride material comprised in the capping layer (60) may be GaN, AlN or AlGaN.

In embodiments, the oxide comprised in the capping layer (60) may be $Al_2O_3$, $Er_2O_3$, $Hf_2O_3$, $ZnO_2$, $Se_2O_3$, or alike materials that allow nucleation of GaN leading to crystalline growth of p-type doped GaN In embodiments, the etch process may be a non-selective etch process, thereby partially recessing the upper layer of the layer stack in the gate region.

Some embodiments, because of the partial recessing the upper layer of the layer stack in the gate region, include a thinning of the upper layer of the layer stack. In embodiments, where the upper layer may be a barrier layer, the barrier layer may be thinned in the recessed gate region, thereby resulting in an increase in the $V_{TH}$ of the HEMT device.

In embodiments, the capping layer may be a capping layer stack. The capping layer stack may have an upper layer consisting of the material.

In embodiments, the capping layer stack may be a Group III-nitride layer stack.

Some embodiments include a capping layer stack may provide additional flexibility in the design of the access region.

Some embodiments include a capping layer stack that allows a variety of etch processing options to remove the p-type doped GaN layer from the access region, thus reducing the risk to damage the upper layer of the layer stack.

Some embodiments, because of the upper layer of the capping layer stack consisting the material, allow for nucleating the p-type doped GaN layer on the access region, as well as in the recessed gate region at a temperature in the range of 750° C. to 1,100° C., thereby allowing non-selective deposition of the p-type doped GaN layer in the recessed gate region and in the access region.

In embodiments, the capping layer may comprise, overlying and in contact with the layer stack, a passivation layer comprising a silicon nitride.

Some embodiments may preserve the passivation layer comprising the silicon nitride after the process steps used to fabricate the HEMT device so that the top surface of the upper layer of the layer stack may be preserved during the fabrication. In some embodiments, where the upper layer may be a barrier layer, the passivation layer comprising the silicon nitride may be preserved to allow for a reduction in the drain lag.

In embodiments, the p-type doped GaN layer formed in the recessed gate region and on the capping layer may be monocrystalline at least in the recessed gate region.

Some embodiments, due to a monocrystalline p-type doped GaN layer, allow for uniform distribution of the p-type dopant.

The monocrystalline p-type doped GaN layer in the access region may avoid segregation of dopants and diffusion of dopants through the grain boundaries.

In embodiments, the method may further comprise removing the p-type doped GaN layer from the capping layer, thereby forming a patterned p-type doped GaN layer in the recessed gate region. The removing may be done by performing a non-selective etch process, thereby partially recessing the capping layer.

Some embodiments, because of a partial recessing of the capping layer, may decrease the 2DEG sheet resistance, thus, allowing for an increase in $I_{DS}$.

In some embodiments, the method may further comprise forming, on the p-type doped GaN layer in the recessed gate region, a patterned gate metal. The forming of the patterned gate metal may be done before or after removing the p-type doped GaN layer in the access region.

Some embodiments, by forming the patterned gate metal before removing the p-type doped GaN layer, may simplify the process flow such that only one lithography process may be sufficient to pattern both the gate metal and the p-type doped GaN layer.

Some embodiments, by forming the patterned gate metal after removing the p-type doped GaN layer, allow for more freedom to design the shape of the p-type doped GaN layer and that of the gate metal layer independently. Furthermore, it allows for applying different kind of metal stacks for use as gate such that resistance of the gate metal may be lowered easily.

In a second aspect, the present disclosure describes a Group III-nitride structure. This Group III-nitride structure may be used in the manufacturing of the enhancement mode Group III-nitride HEMT device.

The Group III-nitride structure comprises a substrate having a main surface. A layer stack is present overlying the main surface, wherein each layer of the layer stack comprises a Group III-nitride material. A capping layer is present on the layer stack. A recessed gate region through the capping layer is present. The recessed gate region exposes, at its bottom, a top surface of an upper layer of the layer stack. A p-type doped GaN layer is present in the recessed gate region and on the capping layer, wherein the capping layer comprises a material susceptible to nucleation of the p-type doped GaN layer at a predetermined temperature in the range of 750° C. to 1,100° C.

Some embodiments allow for fabricating a Group III-nitride HEMT device with increased $V_{TH}$ and increased $I_{DS}$.

In embodiments, the material may be an oxide or an un-doped Group III-nitride material. Some embodiments, because the p-type dopant of the p-type doped GaN layer is activated both in the recessed gate region as well as in the access region, due to the oxide or the un-doped Group III-nitride material of the capping layer, allow for fabricating a HEMT device with increased $V_{TH}$.

In embodiments, the capping layer may be a capping layer stack having an upper layer consisting of the material.

In embodiments, the capping layer stack may be a Group III-nitride layer stack.

Some embodiments include a capping layer stack that may provide additional flexibility in the design of the access region.

Some embodiments have a capping layer stack that allows increased etch processing options to remove the p-doped GaN layer from the access region, thus reducing the risk to damage the upper layer of the layer stack.

Some embodiments have an upper layer of the capping layer stack that allows for nucleating the p-doped GaN layer on the access region, as well as in the recessed gate region at a temperature in the range of 750° C. to 1,100° C., thereby allowing non-selective deposition of the p-doped GaN layer in the recessed gate region and on the access region.

In some embodiments, the capping layer may further comprise, overlying and in contact with the layer stack, a passivation layer comprising a silicon nitride.

Some embodiments have a passivation layer that includes the silicon nitride that also contributes to the increased etch processing options to remove the p-type doped GaN layer from the access region.

The passivation layer comprising the silicon nitride may be maintained during subsequent processes necessary for manufacturing the HEM device, thus contributing to a lower drain drag of the device.

DETAILED DESCRIPTION

Various embodiments will be described with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

Reference throughout the specification to "one embodiment" or "an embodiment" means that a particular feature, structure or characteristic described in connection with the embodiment is included in at least one embodiment. Thus, appearances of the phrases "in one embodiment" or "in an embodiment" in various places throughout the specification are not necessarily all referring to the same embodiment, but may. Furthermore, the particular features, structures or characteristics may be combined in any suitable manner, as would be apparent to one of ordinary skill in the art from the disclosure, in one or more embodiments.

Similarly it should be appreciated that in the description of example embodiments, various features are sometimes grouped together in a single embodiment, figure, or description thereof for the purpose of streamlining the disclosure and aiding in the understanding of one or more of the various inventive aspects. The method of disclosure, however, is not to be interpreted as reflecting an intention that the claims require more features than are expressly recited in each claim. Rather, as the following claims reflect, inventive aspects lie in less than all features of a single foregoing disclosed embodiment. Thus, the claims following the detailed description are hereby expressly incorporated into the detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that various embodiments may be practiced without these specific details. In other instances, well-known methods, structures and techniques have not been shown in detail in order not to obscure an understanding of the description.

The following terms are provided solely to aid in the understanding of the disclosure.

As used herein and unless provided otherwise, the term "access region" refers to the region between a gate region and a source region or between a gate region or a drain region of a HEMT device.

As used herein and unless provided otherwise, the term "non-selective deposition" refers to the deposition of a material on a surface independent of the different layers on that surface.

As used herein and unless provided otherwise, the term "nucleation" refers to initial stages of deposition of p-type doped GaN layer on the capping layer.

As used herein and unless provided otherwise, the term "in-situ" refers to a process that is carried out without having to switch to another the process tool.

As used herein and unless provided otherwise, the term "exposed" refers to a layer, a surface or a region that is not protected from its surrounding environment.

As used herein and unless provided otherwise, the term "III-nitride" refers to a semiconductor material comprising at least one element from Group III of the periodic table of elements and nitrogen such as for example, GaN, AlN, InGaN, AlGaN, InAlN or combinations thereof.

As used herein and unless provided otherwise, the term "drain lag" refers to the drain-current transients in response to drain voltage pulse.

As used herein and unless provided otherwise, the term "loading effect" refers to the influence of the size or the width of the recessed gate region on the growth characteristics of the p-type doped GaN layer such as for example an increased growth rate occurring in the recessed gate region compared to that in the access region.

As used herein and unless provided otherwise, the term "dispersion issues, dispersion behavior" refer to the premature saturation and degradation. In particular it refers to RF-currents or current in pulsed measurement that are much lower than the measured DC value. Dispersion is also referred to as current collapse.

As used herein and unless provided otherwise, the term "p-type doped GaN layer" refers to a layer comprising GaN and a p-type dopant. The p-type dopant may be Mg, Be, Fe or C. The concentration of the p-type dopant may be in the range of 1e17 to 1e21.

Example embodiments will now be described by the following detailed description. It is clear that other embodiments can be configured according to the knowledge of persons skilled in the art without departing from the technical teachings herein.

The method (500) according to the first aspect is illustrated schematically in FIG. 2a to FIG. 2i. The figures show corresponding cross-sections of the structure (1000) at different stages of the method (500). Purely to facilitate understanding, different layers are shown with different numbers, however; this should not be construed in any limiting sense.

We now refer to FIG. 1, FIG. 2a to FIG. 2d and FIG. 3a to FIG. 3d.

Figure 1:
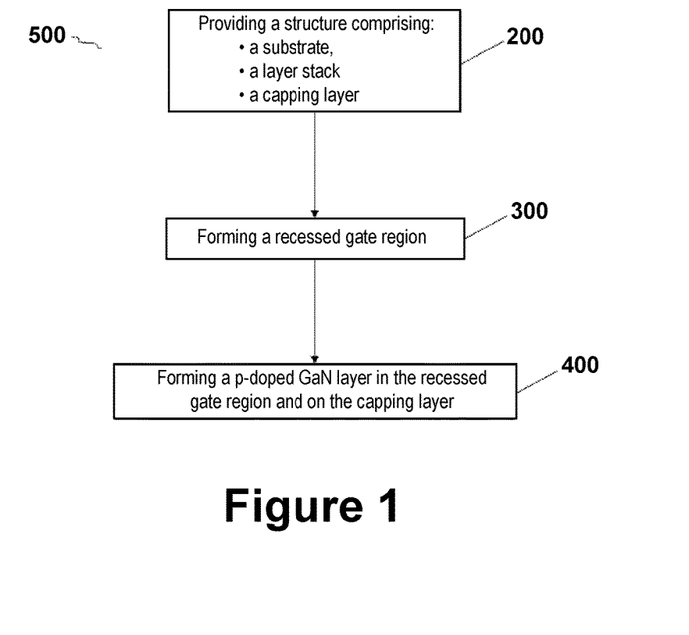
FIG. 1 shows a flowchart of fabricating an enhancement mode Group III-nitride HEMT device, according to example embodiments.

FIG. 1 shows a flowchart of fabricating an enhancement mode Group III-nitride HEMT device according to example embodiments.

Figure 2A:
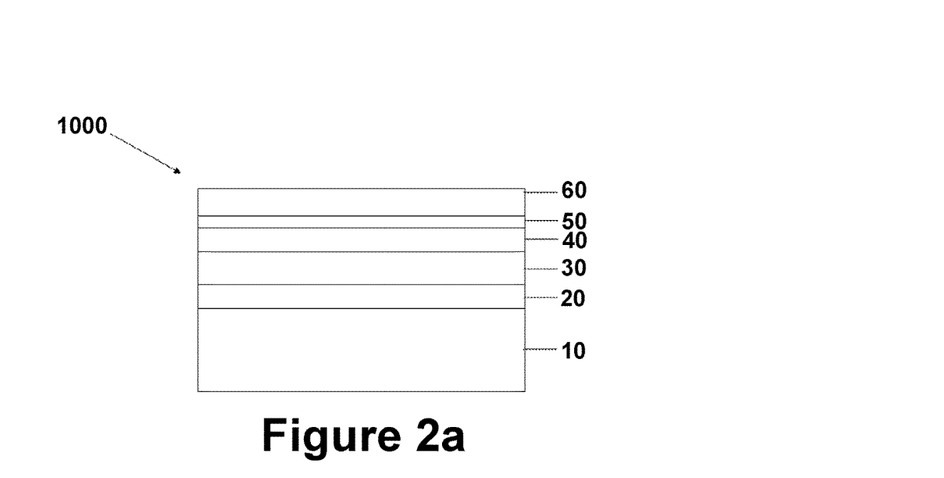
FIG. 2*a* is a schematic of a step in a method of fabricating an enhancement mode Group III-nitride HEMT device, according to example embodiments. Only the gate region of front-end processing is shown.
Figure 3A:
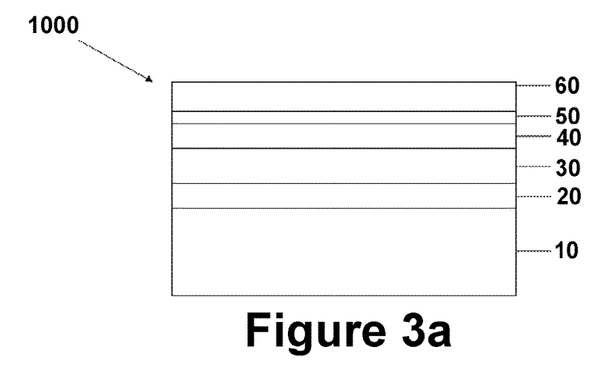
FIG. 3*a* is a schematic of a step in a method of fabricating an enhancement mode Group III-nitride HEMT device, according to example embodiments. Only the gate region of front-end processing is shown.

The method (500) starts with providing (200) a structure (1000), which is schematically shown in FIG. 2a and FIG. 3a. The structure (1000) comprises a substrate (10) having a main surface. A layer stack is present overlying the main surface of the substrate (10). A capping layer (60) is present on the layer stack.

In embodiments, the substrate (10) may comprise a semiconductor substrate such as a doped silicon substrate, an indium phosphide, a germanium, a silicon germanium, a gallium arsenide, a gallium arsenide phosphide substrate. The substrate may comprise a dielectric layer such as a $SiO_2$ or a $Si_3N_4$ layer in addition to the substrate portion. The substrate may also be a silicon-on-glass, silicon-on-AlN, silicon-on-Moor a silicon-on-sapphire substrate.

In some embodiments, the substrate may be a silicon substrate. In some embodiments, the substrate may be a (111) or an equivalent oriented silicon substrate.

In embodiments, each layer of the layer stack may comprise a Group III-nitride material. Each layer of the layer stack may be formed by epitaxial techniques on the main surface of the substrate (10). Each layer of the layer stack may be a multi-layer or a layer having a graded composition.

In embodiments, the layer stack may comprise a nucleation layer (20), a buffer layer (30), a channel layer (40) and a barrier layer (50). The buffer layer (30), the channel layer (40) and the barrier layer (50) are typically referred to as the active layers of the HEMT device.

In embodiments, the capping layer (60) may have a thickness in the range of 1 nm to 2,000 nm.

In embodiments, the capping layer (60) is formed in-situ with the layer stack such as, for example, without breaking the vacuum between the processes used for forming the layer stack and the process of forming the capping layer. The in-situ deposition will be limited to GaN, AlN, AlGaN, InGaN, InAlGaN and $Si_3N_4$. The capping layer (60) may be deposited by MOCVD.

Figure 2B:
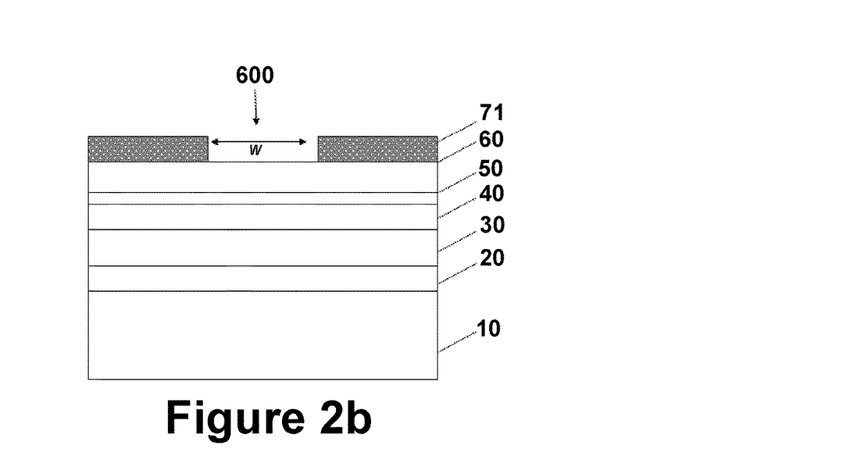
FIG. 2*b* is a schematic of a step in a method of fabricating an enhancement mode Group III-nitride HEMT device, according to example embodiments. Only the gate region of front-end processing is shown.

A recessed gate region is formed through the capping layer (60). The forming of the recessed gate region comprises providing a photoresist layer (not shown in the figures) on the capping layer (60). After performing a lithographic patterning process, patterned photoresist features (71) are formed on the capping layer (60) separated by a gap (600) as schematically shown in FIG. 2b and in FIG.

Figure 2C:
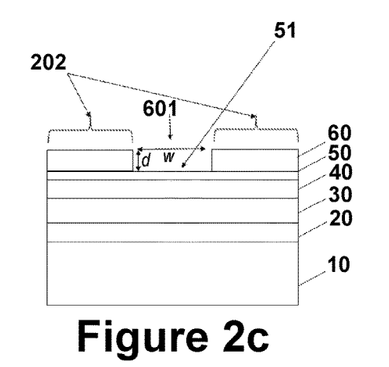
FIG. 2*c* is a schematic of a step in a method of fabricating an enhancement mode Group III-nitride HEMT device, according to example embodiments. Only the gate region of front-end processing is shown.
Figure 3B:
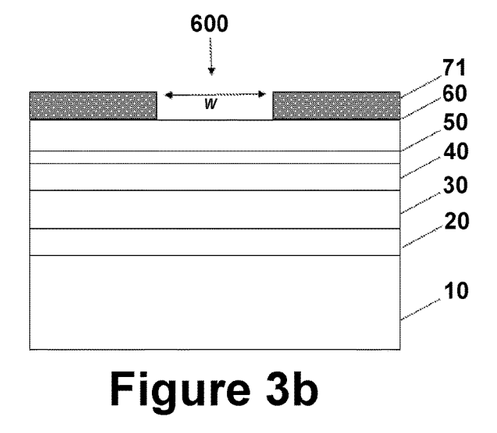
FIG. 3*b* is a schematic of a step in a method of fabricating an enhancement mode Group III-nitride HEMT device, according to example embodiments. Only the gate region of front-end processing is shown.
Figure 3C:
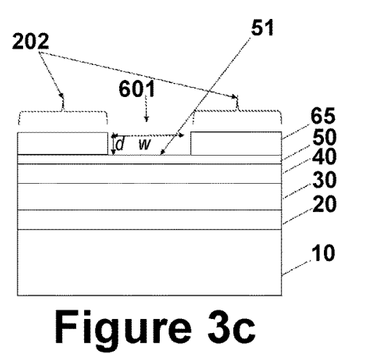
FIG. 3*c* is a schematic of a step in a method of fabricating an enhancement mode Group III-nitride HEMT device, according to example embodiments. Only the gate region of front-end processing is shown.

3b. This gap (600) defines a gate region and the width w of this gap may define a width of the gate region to be formed through the capping layer (60). Using the patterned photoresist features (71) as a mask, an etch process is performed by removing at least the capping layer in the gate region, thereby forming a recessed gate region (601) through the capping layer (60) and exposing at its bottom (51) a top surface of the upper layer (50) of the layer stack as schematically shown in FIG. 2c and FIG. 3c. This recessed gate region (601) has a width of w that is defined by the lithographic patterning process.

In embodiments, the upper layer (50) may comprise a Group III-nitride material. The Group III-nitride material may be an $Al_xGa_{1-x}N$ layer, wherein $0 \leq x \leq 1$. The $Al_xGa_{1-x}N$ layer is formed on top of a channel layer (40) and functions as a barrier layer, thus forming 2DEG In embodiments, the etch process may be a non-selective etch process. The non-selective etch process may partially recess the upper layer (50) of the layer stack (not shown in the figures). In embodiments, where the upper layer (50) is a barrier layer, the non-selective etch process may allow the thickness of this barrier layer to be reduced in the recessed gate region (601). A reduced barrier thickness in the recessed gate region (601) compared to the thickness of the barrier layer in the access region (202) may lead to obtaining a higher $V_{TH}$ value for the HEMT device.

Figure 2D:
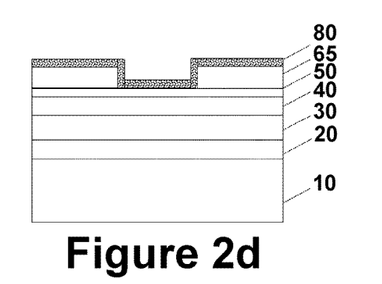
FIG. 2*d* is a schematic of a step in a method of fabricating an enhancement mode Group III-nitride HEMT device, according to example embodiments. Only the gate region of front-end processing is shown.
Figure 3D:
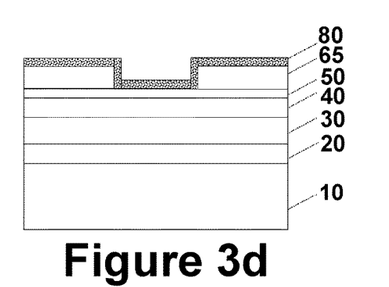
FIG. 3*d* is a schematic of a step in a method of fabricating an enhancement mode Group III-nitride HEMT device, according to example embodiments. Only the gate region of front-end processing is shown.

After formation of the recessed gate region (601) through the capping layer, a p-type doped GaN layer (80) is formed (400) in the recessed gate region (601) and on the capping layer (60) in the access region (202) by performing a non-selective deposition process, as schematically shown in FIG. 2d and in FIG. 3d. The thickness of the p-type doped GaN layer in the recessed gate region (601) may be equal or lower than the depth d of the recessed gate region (601).

In embodiments, the non-selective deposition of the p-type doped GaN layer (80) may be performed by metal organic chemical vapor deposition (MOCVD) or molecular beam epitaxy (MBE).

In embodiments, the p-type doped GaN layer (80) is monocrystalline at least in the recessed gate region. A monocrystalline p-type doped GaN layer (80), at least in the recessed gate region (601), may provide uniform distribution of the p-type dopant in comparison to a polycrystalline p-dope GaN layer, in which the p-type dopant may diffuse to the grain boundaries thereby distorting the distribution and uniformity of the p-type dopant in the p-type doped GaN layer.

A monocrystalline p-type doped GaN layer, both in the recessed gate region and on top of the cap layer, may prevent a transition between the poly and mono-crystalline part of the p-type doped layer from taking place in the capping region. Such a transition between poly- and mono-crystalline layers could lead to non-uniform incorporation of Mg in this area.

The non-selective deposition of the p-type doped GaN layer (80) may be performed at a predetermined temperature in the range of 750° C. to 1,100° C. and the capping layer (60) comprises a material susceptible to nucleation of the p-type doped GaN layer at that predetermined temperature.

Carrying out the non-selective deposition, thanks to this capping layer (60), will enable the growth of the p-type doped GaN layer (80) independent of the size or of the width w of the recessed gate region (601). Consequently, the associated p-dopant concentration in the grown p-type doped GaN layer (80) and, thus, the degree of activation of this p dopant will be uniform in the grown p-type doped GaN layer (80) and will be independent of the size or of the width w of the recessed gate region (601). This contributes to an increase in the freedom of defining the size or the width of the recessed gate region without the concerns related to (i) adjustment of the growth recipe of the p-type doped GaN layer, and (ii) the p dopant concentration, thus overcoming loading effects.

Furthermore, carrying out the non-selective deposition at such a high predetermined temperature, thanks to the susceptibility of the material comprised in the capping layer (60) to nucleation of the p-type doped GaN layer (80), will aid in achieving an increased activation of the p dopant in the grown p-type doped GaN layer in comparison to what is obtained in a selective or non-selective deposition performed at a lower temperature than this predetermined temperature. Increased activation of the p dopant in the grown p-type doped GaN layer results in obtaining an increased $V_{TH}$ of the HEMT device, thus contributing to increased device performance.

In embodiments, the material comprised in the capping layer may be an un-doped Group III-nitride material. The un-doped Group III-nitride material may be GaN, AlN, AlGaN, InGaN, or similar materials.

In alternative embodiments, the material comprised in the capping layer may be an oxide. The oxide may be $Al_2O_3$, $Er_2O_3$, $Hf_2O_3$ $ZnO_2$, $Se_2O_3$ or alike materials that allow nucleation of GaN leading to crystalline growth of p-GaN.

Nucleation and growth of p-type doped GaN layer on the capping layer can be monitored in real time from in-situ reflectance monitoring during the MOCVD process.

In embodiments, the capping layer (60) may comprise, overlying and in contact with the layer stack, a passivation layer (not shown in the figures). The passivation layer may be a silicon nitride layer. In some embodiments, the silicon nitride passivation layer may be formed by metal organic chemical vapor deposition (MOCVD) process at a temperature in the range of 900° C. to 1,250° C. The thickness of the silicon nitride passivation layer may be in the range of 0.1 nm to 2,000 nm. In these embodiments, a polycrystalline GaN layer having a thickness in the range of 0.1 nm to 1,000 nm may be present on this silicon nitride passivation layer. This polycrystalline GaN layer is susceptible to nucleation of the p-type doped GaN layer at the predetermined temperature. In embodiments, where the upper layer (50) of the layer stack is the barrier layer, the silicon nitride passivation layer overlays and is in contact with the barrier layer.

In embodiments, the capping layer (60) may be a capping layer stack having an upper layer consisting of the material susceptible to nucleation of the p-type doped GaN layer at the predetermined temperature. The capping layer stack may be a Group III-nitride layer stack. None of the layers of the Group III-nitride layer stack of the capping layer are doped.

In embodiments, the capping layer stack may also comprise the silicon nitride passivation layer that overlays and is in contact with the layer stack. In embodiments, where the upper layer (50) of the layer stack is the barrier layer, the silicon nitride passivation layer comprised in the capping layer stack overlays and is in contact with the barrier layer.

Figure 2E:
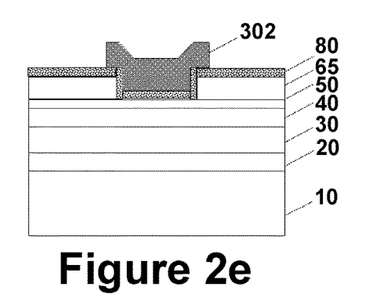
FIG. 2*e* is a schematic of a step in a method of fabricating an enhancement mode Group III-nitride HEMT device, according to example embodiments. Only the gate region of front-end processing is shown.
Figure 2F:
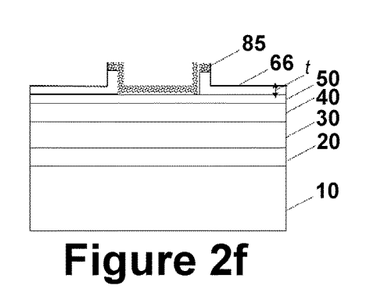
FIG. 2*f* is a schematic of a step in a method of fabricating an enhancement mode Group III-nitride HEMT device, according to example embodiments. Only the gate region of front-end processing is shown.
Figure 3E:
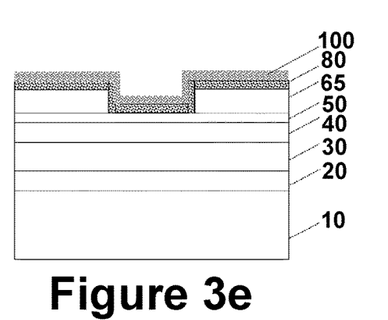
FIG. 3*e* is a schematic of a step in a method of fabricating an enhancement mode Group III-nitride HEMT device, according to example embodiments. Only the gate region of front-end processing is shown.
Figure 3F:
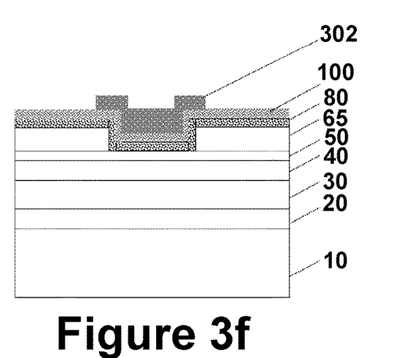
FIG. 3*f* is a schematic of a step in a method of fabricating an enhancement mode Group III-nitride HEMT device, according to example embodiments. Only the gate region of front-end processing is shown.
Figure 3G:
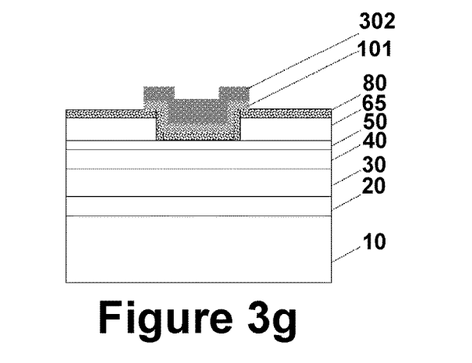
FIG. 3*g* is a schematic of a step in a method of fabricating an enhancement mode Group III-nitride HEMT device, according to example embodiments. Only the gate region of front-end processing is shown.
Figure 3H:
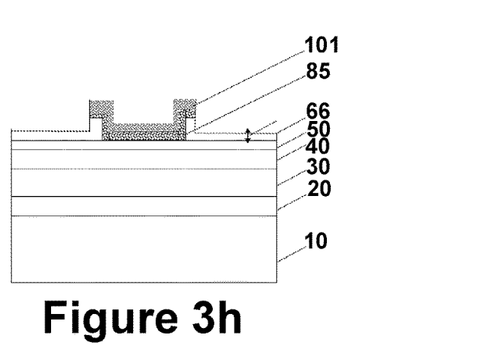
FIG. 3*h* is a schematic of a step in a method of fabricating an enhancement mode Group III-nitride HEMT device, according to example embodiments. Only the gate region of front-end processing is shown.

In embodiments, the method may further comprise removing the p-type doped GaN layer (80) from the capping layer (60) present in the access region (202), thereby forming a patterned p-type doped GaN layer (85) in the recessed gate region (601) as schematically shown in FIG. 2f and FIG. 3h. The removing may be done by performing a non-selective etch process, thereby partially recessing the capping layer. The non-selective etch process may be a dry etch process. The partial recessing of the capping layer (60) in the access region (202) may decrease the 2DEG sheet resistance with the decrease in the thickness of the capping layer, thus, allowing for an increase in $I_{DS}$ of the HEMT device.

In embodiments, the non-selective etching may be controlled by monitoring the etch time. The etch time may be calculated based on the thickness of the p-type doped GaN layer (80) to be removed in the access region (202) so that the capping layer (60) is exposed and the recess in the capping layer (60). The duration of the non-selective etch process may be timed such that there is a critical thickness t of capping layer (60) remaining in the access region (202). Non-selective etching proceeding until beyond this critical thickness may pose the risk of creating etch damage to the upper layer (50) of the layer stack, wherein the upper layer may be the barrier layer. Etch damage may result in removal of the capping layer (60) completely at certain locations in the access region (202), and may, thus, damage the barrier layer. Damaging the barrier layer may lead to undesirable performance variations and performance issues. These performance variations and performance issues may include differing 2DEG sheet resistance, differing ohmic contact resistance ($R_C$) at source and drain ohmic contact, on-resistance of the HEMT ($R_{ON}$), and source-drain current ($I_{DS}$).

During MOCVD growth, local thickness variations of the regrown p-type doped GaN layer and the capping layer (60), may create issues when forming ohmic contacts in the access region (202). During the process of creating the ohmic contacts, the capping layer (60) is locally etched possibly followed by etching of the barrier layer, stopping the dry etch process on time, etching just into the GaN channel (40). Etching too deep into the GaN channel will lead to increased contact resistance ($R_C$). In case a large thickness variation in the capping layer (60) is present, an etch stop layer may be used to allow to control the total etch depth of the ohmic recess.

In embodiments, an etch stop layer (not shown in the figures) may be included in the capping layer (60). The etch stop layer may allow for stopping the non-selective etching of the p-type doped GaN layer at a desired location in the capping layer. Furthermore, the etch stop layer facilitates to obtain a smooth surface since etching can be made selective to the etch stop layer. Therefore, the problem of non-uniformities in the p-type doped GaN layer in the access region that may have been caused by the timed dry etch process may be alleviated by the use of the etch stop layer.

The etch stop layer may be positioned in the capping layer at a sufficient distance away from the barrier layer such that any possible damaging effect of the etch process may be avoided.

In embodiments, the etch stop layer may further be removed by using a suitable etch chemistry if its presence results in the formation of a second channel or formation of a possible conductive path that may create a short between gate and source or between gate and drain.

In alternative embodiments, the etch stop layer may be kept in the layer stack if its presence does not result in the formation of a second channel or formation of a possible conductive path that may create a short between gate and source or between gate and drain.

In some embodiments, the etch stop layer may be a Group III-nitride material.

In some embodiments, the etch stop layer may be an AlGaN layer or an AlN layer.

In some embodiments, the AlGaN or AlN etch stop layer is aluminum-rich, which may enhance etch stopping behavior.

In certain embodiments, the aluminum content of the AlGaN or AlN etch stop layer may be higher than 15%.

In other embodiments, aluminum content of the AlGaN or AlN etch stop layer may be in the range of 1% to 100%.

Figure 2G:
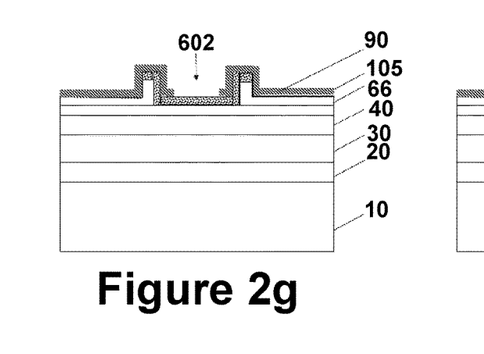
FIG. 2*g* is a schematic of a step in a method of fabricating an enhancement mode Group III-nitride HEMT device, according to example embodiments. Only the gate region of front-end processing is shown.
Figure 2H:
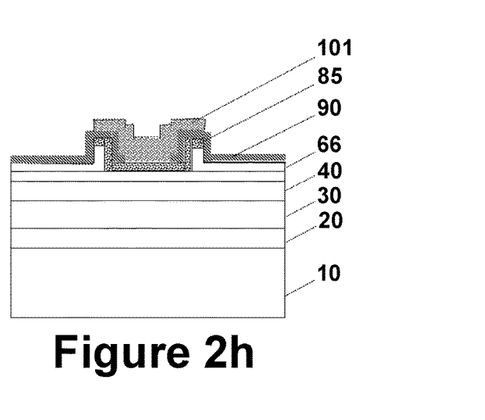
FIG. 2*h* is a schematic of a step in a method of fabricating an enhancement mode Group III-nitride HEMT device, according to example embodiments. Only the gate region of front-end processing is shown.

In embodiments, the method further comprises forming, on the p-type doped GaN layer in the recessed gate region, a patterned gate metal (101) as schematically shown in FIG. 2h and FIG. 3g.

In embodiments, the forming of the patterned gate metal may be done before or after removing the p-type doped GaN layer (80) from the access region (202).

We now refer to FIG. 2e to FIG. 2h showing schematically the formation of the patterned gate metal (101) after removing the p-type doped GaN layer (80) from the access region (202).

The formation of the patterned gate metal after removing the p-type doped GaN layer (80) from the access region (202) may provide more freedom to design the shape of the p-type doped GaN layer and the shape of the gate metal layer independently.

A patterned photoresist feature (302) is provided that masks the p-type doped GaN layer (80) in the recessed gate region (601) (FIG. 2e). The p-type doped GaN layer (80) in the access region (202), which is not covered by the photoresist feature (302), is removed by the non-selective etch process (FIG. 2f), thereby forming a patterned p-type doped GaN layer (85). The patterned p-type doped GaN layer (85) remains covering the recessed gate region (202). The non-selective etch process, therefore, partially recesses the capping layer (60) in the access region (202) down to a thickness t, thereby forming a recessed capping layer (66) on the access region (202).

A passivation dielectric layer, which may be a silicon nitride passivation layer, is provided overlying and in contact with the recessed capping layer (66) in the access region (202) and the patterned p-type doped GaN layer (85) in the recessed gate region (601). The silicon nitride passivation layer may be deposited by performing a Rapid Thermal Chemical Vapor Deposition (RTCVD), Low Pressure Chemical Vapor Deposition (LPCVD) or Plasma Enhanced Chemical Vapor Deposition (PECVD). The thickness of the silicon nitride passivation layer may be in the range of 1 nm to 1000 nm. Performing a lithographic patterning process followed by an etch process may result in the formation of a patterned silicon nitride passivation layer (90). The patterned silicon nitride passivation layer (90) may have an opening (602) aligned with the recessed gate region (202) exposing, at its bottom (51), a part of the patterned p-type doped GaN layer (85) in the recessed gate region (202) (FIG. 2g).

The interface between the patterned silicon nitride passivation layer (90) and the recessed capping layer (66) is far from the 2DEG by the critical thickness t thus contributing to improved dispersion performance.

A gate metal is provided overlying and in contact with the patterned silicon nitride passivation layer (90) and with the exposed part of the patterned p-type doped GaN layer (85) at the bottom of the opening (602) in the recessed gate region (601). The gate metal may be provided by performing a sputtering process. The thickness of the gate metal may be in the range of 50 nm to 1,000 nm. Performing a lithographic patterning process followed by an etch process may result in the formation of a patterned gate metal (101) in the recessed gate region (601) (FIG. 2h).

Figure 2I:
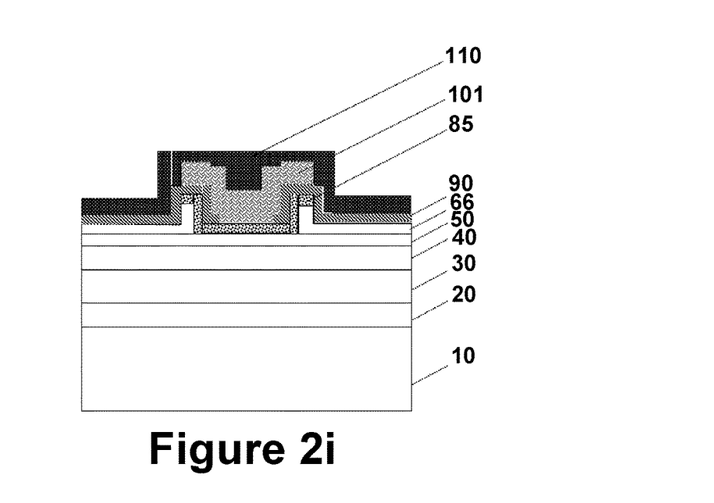
FIG. 2*i* is a schematic of a step in a method of fabricating an enhancement mode Group III-nitride HEMT device, according to example embodiments. Only the gate region of front-end processing is shown.

Thereafter, a dielectric, such as silicon nitride gate capping layer (110) is provided overlying and in contact with the patterned gate metal (101) and with the exposed patterned silicon nitride passivation layer (90) in the access region (FIG. 2i). This silicon nitride gate capping layer (110) may be provided by performing a Rapid Thermal Chemical Vapor Deposition (RTCVD), Low Pressure Chemical Vapor Deposition (LPCVD) or Plasma Enhanced Chemical Vapor Deposition (PECVD). The thickness of this silicon nitride gate capping layer (110) may be in the range of 1 nm to 1,000 nm.

Providing the gate metal after forming the patterned p-type doped GaN layer (85) may allow for implementing different kind of metal stacks, such as, for example, those that may include aluminum, since the patterned gate metal (101) is provided after providing the silicon nitride passivation layer (90). This may lead to easy reduction of the resistance of the gate metal (101).

Providing the gate metal after forming the patterned p-type doped GaN layer (85) may allow formation of an extension of the patterned gate metal outside the recessed gate region (601) that serves as field plate.

We now refer to FIG. 3e to FIG. 3h showing schematically the formation of the patterned gate metal (101) before removing the p-type doped GaN layer (80) from the access region (202).

The formation of the patterned gate metal before removing the p-type doped GaN layer (80) from the access region (202) may permit the gate metal and the p-type doped GaN layer (80) to be etched together in one etch sequence. Thus, the pattern of the patterned gate metal (101) and the pattern of the patterned p-type doped GaN layer (85) may be the same.

Figure 3I:
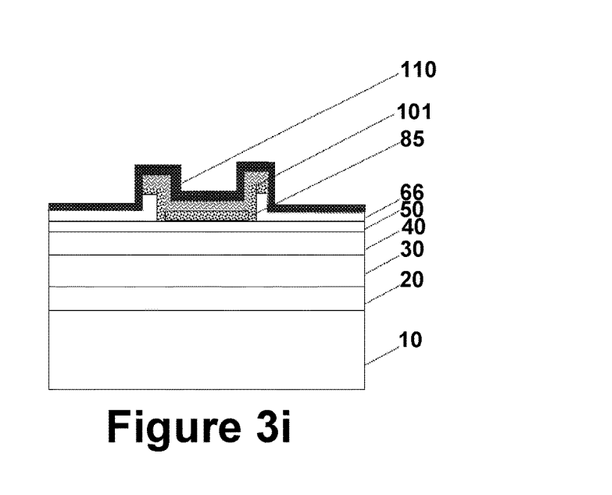
FIG. 3*i* is a schematic of a step in a method of fabricating an enhancement mode Group III-nitride HEMT device, according to example embodiments. Only the gate region of front-end processing is shown.

A gate metal layer (100) is provided on the p-type doped GaN layer (80) (FIG. 3e). A patterned photoresist feature (301) may be provided that masks the gate metal layer (100) layer in the recessed gate region (601) (FIG. 3f). The gate metal layer (100) in the access region (202), which is not covered by the photoresist feature (301), may be removed by a selective etch process (FIG. 3g), thereby forming a patterned gate metal layer (101) and stopping on the p-type doped Gan layer (80). Next, by performing the non-selective etch process, a patterned p-type doped GaN layer (85) is formed. As a result of the non-selective etch process partial recessing into the capping layer (60) may occur thereby forming the recessed capping layer (66) (FIG. 3h). Thereafter, a silicon nitride gate capping layer (110) may be provided overlying and in contact with the patterned gate metal (101) and with the exposed recessed capping layer (66)) in the access region (FIG. 3i). The interface between the silicon nitride gate capping layer (110) and the recessed capping layer (66) is separated from the 2DEG by the critical thickness, t, thus contributing to improved dispersion performance.

In a second aspect, the present disclosure describes a Group III-nitride structure. This Group III-nitride structure may be used in the manufacturing of the enhancement mode Group III-nitride HEMT device.

Figure 4:
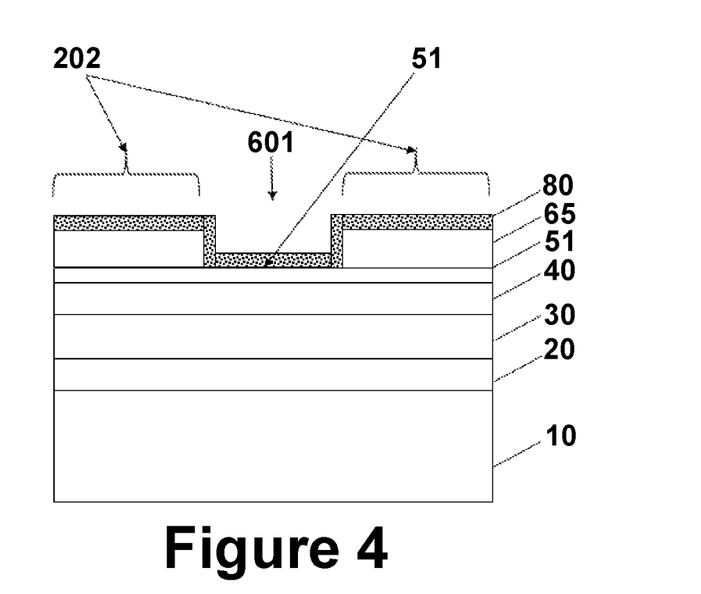
FIG. 4 is a schematic of a Group III-nitride structure fabricated according to a method, according to example embodiments.

We now refer to FIG. 4 that shows schematically a Group III-nitride structure according to some embodiments.

In embodiments, the Group III-nitride structure comprises a substrate (10) having a main surface, a layer stack overlying the main surface and a capping layer (60) on the layer stack. Each layer of the layer stack may comprise a Group III-nitride material. A recessed gate region (601) through the capping layer (60) is present. The recessed gate region (601) exposes, at its bottom (51), a top surface of an upper layer (50) of the layer stack. A p-type doped GaN layer (80) is present in the recessed gate region (601) in contact with the top surface of the upper layer (50) and on the capping layer (60) in the access region (202). The capping layer comprises a material susceptible to nucleation of the p-type doped GaN layer at a predetermined temperature in the range of 750° C. to 1,100° C.

In embodiments, the material of the capping layer (60) may be an oxide or an un-doped group III-nitride material.

This Group III-nitride structure, when used for fabricating a Group III-nitride HEMT device, may yield increased performance. The capping layer (60) comprising the material susceptible to nucleation of the p-type doped GaN layer at a predetermined temperature in the range of 750° C. to 1,100° C. may allow the p-type doped GaN layer to be non-selectively deposited, such that the associated p-dopant concentration in the p-type doped GaN layer (80) grown in the recessed gate region (601) and on the capping layer in the access region (202) will be uniform. Furthermore, the degree of activation of this p-type dopant will be improved and uniform in the grown p-type doped GaN layer (80) thus, allowing to obtain a HEMT device with increased $V_{TH}$.

In embodiments, the p-type doped GaN layer in the recessed gate region and on the capping layer may be monocrystalline at least in the recessed gate region.

Some embodiments include a monocrystalline, p-type doped GaN layer that allows for uniform distribution of the p-dopant.

The monocrystalline p-type doped GaN layer in the access region may avoid segregation of dopants and diffusion of dopants through the grain boundaries.

In embodiments, the substrate (10) may comprise a semiconductor substrate such as a doped silicon substrate, an indium phosphide, a germanium, a silicon germanium, a gallium arsenide, a gallium arsenide phosphide substrate. The substrate may comprise a dielectric layer such as a $SiO_2$ or a $Si_3N_4$ layer in addition to the substrate portion. The substrate may also be a silicon-on-glass, silicon-on-AlN, silicon-on-Moor a silicon-on-sapphire substrate.

In some embodiments, the substrate may be a silicon substrate. In some embodiments, the substrate may be a (111) or an equivalent oriented silicon substrate.

In embodiments, each layer of the layer stack may comprise a Group III-nitride material. Each layer of the layer stack may be a multi-layer or a layer having a graded composition.

In embodiments, the layer stack may comprise a nucleation layer (20), a buffer layer (30), a channel layer (40) and a barrier layer (50). The buffer layer (30), the channel layer (40) and the barrier layer (50) are typically referred to as the active layers of the HEMT device.

In embodiments, the upper layer of the layer stack may be III-Nitride material (50).

What is claimed is:
1. A method for fabricating an enhancement mode Group III-nitride HEMT device, the method comprising:
  providing a structure comprising:
    a substrate having a main surface;
    a layer stack overlying the main surface, wherein each layer of the layer stack comprises a Group III-nitride material; and
    a capping layer on the layer stack;
  forming a recessed gate region by removing, in a gate region, at least the capping layer by performing an etch process, thereby exposing a top surface of an upper layer of the layer stack; and
  forming a monocrystalline p-type doped GaN layer in the recessed gate region and on the capping layer by performing a non-selective deposition process, wherein the non-selective deposition process is performed at a predetermined temperature between 750° C. to 1,100° C., and
wherein the capping layer comprises a material susceptible to nucleation of the monocrystalline p-type doped GaN layer at the predetermined temperature.

2. The method according to claim 1, wherein the capping layer is formed in-situ with the layer stack.

3. The method according to claim 1, wherein the material susceptible to nucleation of the monocrystalline p-type doped GaN layer is an oxide or an un-doped Group III-nitride material.

4. The method according to claim 1,
wherein the etch process is a non-selective etch process, and
wherein the non-selective etch process partially recesses the upper layer of the layer stack in the gate region.

5. The method according to claim 1, wherein the capping layer comprises an etch stop layer configured to stop a non-selective etching of the monocrystalline p-type doped GaN layer at a desired location in the capping layer.

6. The method according to claim 1,
wherein the capping layer comprises a passivation layer comprising a silicon nitride, and
wherein the passivation layer overlies and is in contact with the layer stack.

7. The method according to claim 1, further comprising:
removing the monocrystalline p-type doped GaN layer from the capping layer, thereby forming a patterned p-type doped GaN layer in the recessed gate region,
wherein removing the monocrystalline p-type doped GaN layer comprises performing a non-selective etch process, thereby partially recessing the capping layer.

8. The method of claim 1, wherein the non-selective deposition process is performed by metal organic chemical vapor deposition (MOCVD).

9. The method according to claim 1,
wherein the capping layer is a capping layer stack, and
wherein the capping layer stack comprises an upper layer consisting of the material susceptible to nucleation of the monocrystalline p-type doped GaN layer.

10. A Group III-nitride structure comprising:
a substrate having a main surface;
a layer stack overlying the main surface, wherein each layer of the layer stack comprises a Group III-nitride material;
a capping layer on the layer stack;
a recessed gate region through the capping layer; and
a monocrystalline p-type doped GaN layer in the recessed gate region and on the capping layer, and
wherein the capping layer comprises a material susceptible to nucleation of the monocrystalline p-type doped GaN layer at a predetermined temperature between 750° C. to 1,100° C.

11. The Group III-nitride structure according to claim 10, wherein the material susceptible to nucleation of the monocrystalline p-type doped GaN layer is an oxide or an un-doped Group III-nitride material.

12. The Group III-nitride structure according to claim 10,
wherein the capping layer is a capping layer stack, and
wherein the capping layer stack comprises an upper layer consisting of the material susceptible to nucleation of the monocrystalline p-type doped GaN layer.

13. The Group III-nitride structure according to claim 10,
wherein the capping layer comprises a passivation layer comprising a silicon nitride, and
wherein the passivation layer overlies and is in contact with the layer stack.

14. The Group III-nitride structure according to claim 10, wherein the capping layer is formed in-situ with the layer stack.

15. An enhancement mode Group III-nitride HEMT device comprising:
a substrate having a main surface;
a layer stack overlying the main surface, wherein each layer of the layer stack comprises a Group III-nitride material;
a capping layer on the layer stack;
a recessed gate region through the capping layer; and
a monocrystalline p-type doped GaN layer in the recessed gate region and on the capping layer,
wherein the capping layer comprises an un-doped Group III-nitride material susceptible to nucleation of the monocrystalline p-type doped GaN layer at a predetermined temperature between 750° C. to 1,100° C.

16. The enhancement mode Group III-nitride HEMT device according to claim 15,
wherein the capping layer is a capping layer stack, and
wherein the capping layer stack comprises an upper layer consisting of the un-doped Group III-nitride material susceptible to nucleation of the monocrystalline p-type doped GaN layer.

17. The enhancement mode Group III-nitride HEMT device according to claim 16, wherein each layer in the capping layer stack is un-doped.

18. The enhancement mode Group III-nitride HEMT device according to claim 15,
wherein the capping layer comprises a passivation layer comprising a silicon nitride,
wherein the passivation layer overlies and is in contact with the layer stack,
wherein the capping layer comprises a polycrystalline GaN layer on the passivation layer, and
wherein the polycrystalline GaN layer comprises the un-doped Group III-nitride material susceptible to nucleation of the monocrystalline p-type doped GaN layer.

19. The enhancement mode Group III-nitride HEMT device according to claim 15, wherein the capping layer is formed in-situ with the layer stack.

\* \* \* \* \*